(12) United States Patent
Shih et al.

(10) Patent No.: US 9,748,184 B2
(45) Date of Patent: Aug. 29, 2017

(54) WAFER LEVEL PACKAGE WITH TSV-LESS INTERPOSER

(71) Applicant: Micron Technology, Inc., Boise, ID (US)

(72) Inventors: Shing-Yih Shih, New Taipei (TW); Hsu Chiang, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/883,632

(22) Filed: Oct. 15, 2015

(65) Prior Publication Data
US 2017/0110419 A1    Apr. 20, 2017

(51) Int. Cl.
| H01L 23/00 | (2006.01) |
|---|---|
| H01L 23/58 | (2006.01) |
| H01L 23/552 | (2006.01) |
| H01L 25/065 | (2006.01) |
| H01L 23/498 | (2006.01) |

(52) U.S. Cl.
CPC .......... *H01L 23/585* (2013.01); *H01L 23/498* (2013.01); *H01L 23/49811* (2013.01); *H01L 23/552* (2013.01); *H01L 25/0655* (2013.01)

(58) Field of Classification Search
CPC .............................. H01L 23/585; H01L 23/498
See application file for complete search history.

(56) References Cited

U.S. PATENT DOCUMENTS

| 8,633,086 B2 | 1/2014 | Kalnitsky | |
|---|---|---|---|
| 2013/0043581 A1* | 2/2013 | Negoro | H01L 23/13 257/712 |
| 2014/0353838 A1* | 12/2014 | Lin | H01L 24/97 257/773 |

FOREIGN PATENT DOCUMENTS

| CN | 102117770 A | 7/2011 |
|---|---|---|
| TW | 440521 | 6/2001 |
| TW | 200531232 | 9/2005 |
| TW | 200915527 | 4/2009 |
| TW | 201530734 A | 8/2015 |
| TW | 201532234 A | 8/2015 |

* cited by examiner

*Primary Examiner* — Tran Tran
(74) *Attorney, Agent, or Firm* — TraskBritt

(57) ABSTRACT

A semiconductor device includes an interposer having a first side and a second side opposite to the first side; a first semiconductor die mounted on the first side within a first chip mounting area through a plurality of first bumps; a second semiconductor die mounted on the first side within a second chip mounting area being adjacent to the first chip mounting area; a ring-shaped supporting feature disposed on the first side and encompassing the first chip mounting area and the second chip mounting area; and a plurality of solder bumps mounted on the second side.

10 Claims, 8 Drawing Sheets

WAFER LEVEL PACKAGE WITH TSV-LESS INTERPOSER

BACKGROUND OF THE INVENTION

1. Field of the Invention

The present disclosure relates generally to the field of semiconductor packaging. More particularly, the present disclosure relates to a wafer level package (WLP) with a Through Silicon Via-less (TSV-less) interposer.

2. Description of the Prior Art

A 2.5D semiconductor package such as CoWoS (Chip-on-Wafer-on-Substrate) is known in the art. CoWoS (Chip-on-Wafer-on-Substrate) typically uses Through Silicon Via (TSV) technology to integrate multiple chips into a single device. This architecture provides higher density interconnects, decreases global interconnect length, and lightens associated RC loading, resulting in enhanced performance and reduced power consumption on a smaller form factor.

As known in the art, the 2.5D semiconductor package places several die side-by-side on a TSV silicon interposer. The TSV silicon interposer is costly because fabricating the interposer substrate with TSVs is a complex process. Thus, forming WLP products that includes an interposer having TSVs may be undesirable for certain applications.

Typically, the reliability test or yield test is performed after all the semiconductor dies are mounted on the interposer and encapsulated by a molding compound. However, such approach has a higher risk of known good die loss. Further, the thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious, especially in a large sized wafer, and has raised an obstacle to a wafer level semiconductor packaging process that requires a fine-pitch RDL process. Therefore, there remains a need in the art for an improved method of manufacturing wafer level packages.

SUMMARY OF THE INVENTION

The present disclosure is directed to provide an improved semiconductor device and fabrication method that is capable of reducing the risk of known good die loss and solving the warpage problem.

In one aspect of the disclosure, a semiconductor device includes an interposer having a first side and a second side opposite to the first side; a first semiconductor die mounted on the first side within a first chip mounting area through a plurality of first bumps; a second semiconductor die mounted on the first side within a second chip mounting area being adjacent to the first chip mounting area; a ring-shaped supporting feature disposed on the first side and encompassing the first chip mounting area and the second chip mounting area; and a plurality of solder bumps mounted on the second side.

According to one embodiment of the disclosure, the interposer comprises a redistribution layer (RDL). The RDL comprises at least one dielectric layer and at least one metal layer. The interposer does not comprise a through silicon via (TSV) or a TSV substrate.

According to one embodiment of the disclosure, the ring-shaped supporting feature is a 3D printed feature. The semiconductor device may further comprise a shielding feature directly disposed on a top surface and side surfaces of the first semiconductor die.

These and other objectives of the present invention will no doubt become obvious to those of ordinary skill in the art after reading the following detailed description of the preferred embodiment that is illustrated in the various drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 to FIG. 12 are schematic diagrams showing an exemplary method for fabricating a wafer level package (WLP) with a TSV-less interposer according to one embodiment of the invention, wherein FIG. 8 is a top view of the intermediate WLP product;

DETAILED DESCRIPTION

Figure 1:
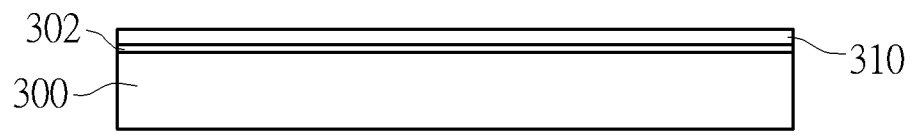

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die", "semiconductor chip", and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Please refer to FIG. 1 to FIG. 12. FIG. 1 to FIG. 12 are schematic diagrams showing an exemplary method for fabricating a wafer level package (WLP) with a TSV-less interposer according to one embodiment of the invention.

As shown in FIG. 1, a carrier 300 is prepared. The carrier 300 may be a releasable substrate material with an adhesive layer 302. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Figure 2:
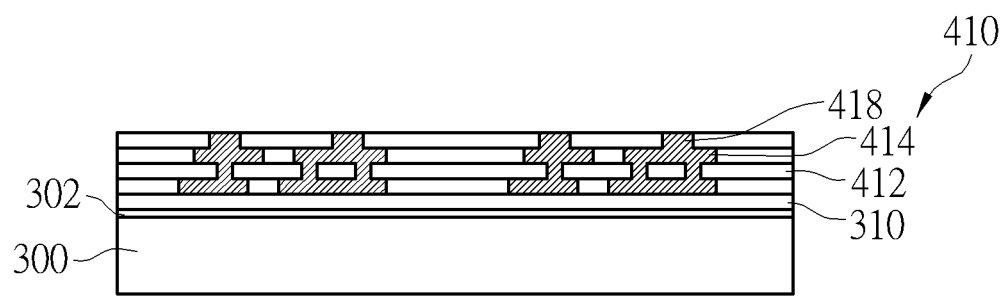

As shown in FIG. 2, subsequently, a redistribution layer (RDL) 410 is formed on the passivation layer 310. The RDL 410 acts as an RDL interposer that is able to fan out the input/output (I/O) pads on a semiconductor die. The RDL 410 may comprise at least one dielectric layer 412 and at least one metal layer 414. The dielectric layer 412 may comprise organic materials such as polyimide (PI) or inorganic materials such as silicon nitride, silicon oxide or the like, but is not limited thereto. The metal layer 414 may comprise aluminum, copper, tungsten, titanium, titanium nitride, or the like. According to the illustrated embodiment, the metal layer 414 may comprise a plurality of solder pads 418 exposed from a top surface of the dielectric layer 412.

Figure 3:
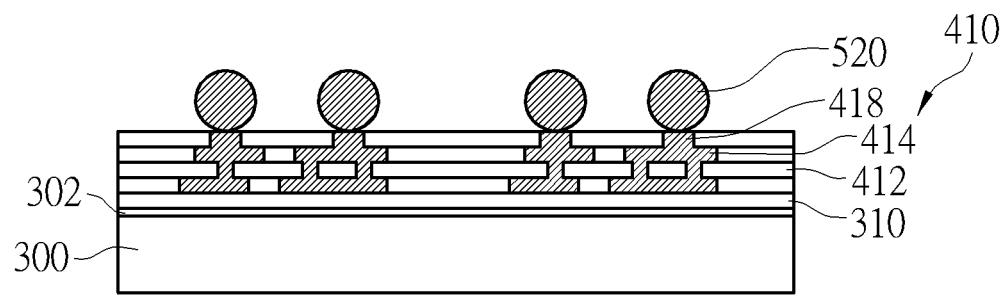

As shown in FIG. 3, after the formation of the RDL 410, solder bumps or solder balls 520 are formed on the respective solder pads 418. According to the illustrated embodiment, the solder balls 520 may comprise controlled collapse chip connection (C4) solder balls.

Figure 4:
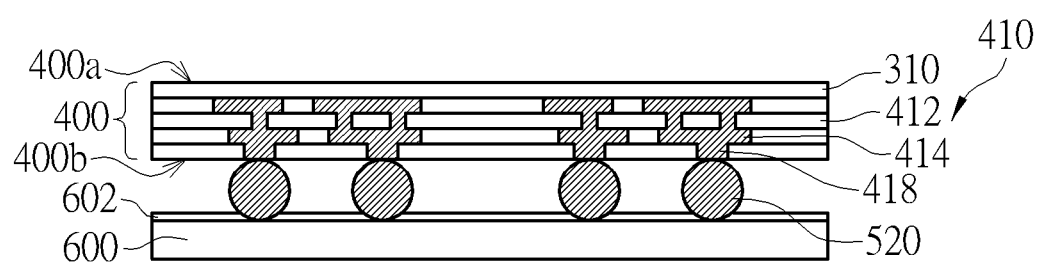

As shown in FIG. 4, the intermediate WLP product is then adhered to another carrier 600. The solder balls 520 face toward, and may contact, the carrier 600. The carrier 600 may be a glass substrate, but is not limited thereto. Optionally, an adhesive layer 602 may be used. Subsequently, the carrier 300 is removed to thereby expose a major surface of the passivation layer 310. The RDL 410 and the passivation layer 310 constitute an interposer or a TSV-less interposer 400. The TSV-less interposer 400 has a first side 400a and a second side 400b that is opposite to the first side 400a. The debonding of the carrier 300 may be performed by using a laser process or UV (ultraviolet) irradiation process, but is not limited thereto.

Figure 5:
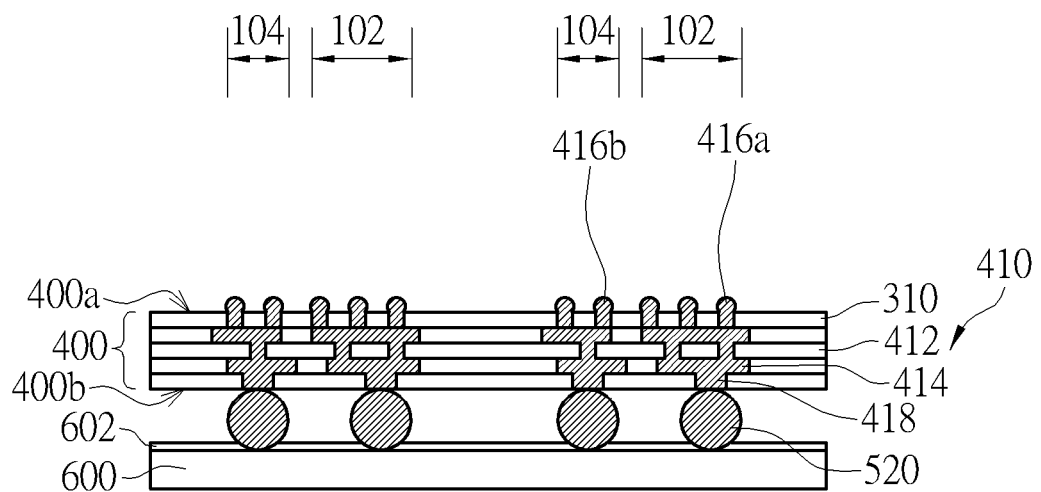

As shown in FIG. 5, after debonding the carrier 300, openings may be formed in the passivation layer 310 to expose respective bump pads in the metal layer 414 on the first side 400a of the TSV-less interposer, and then bumps 416a and 416b, such as micro-bumps may be formed on the respective bump pads. The bumps 416a are disposed within a first chip mounting area 102 and the bumps 416b are disposed within a second chip mounting area 104 adjacent to the first chip mounting area 102.

Figure 6:
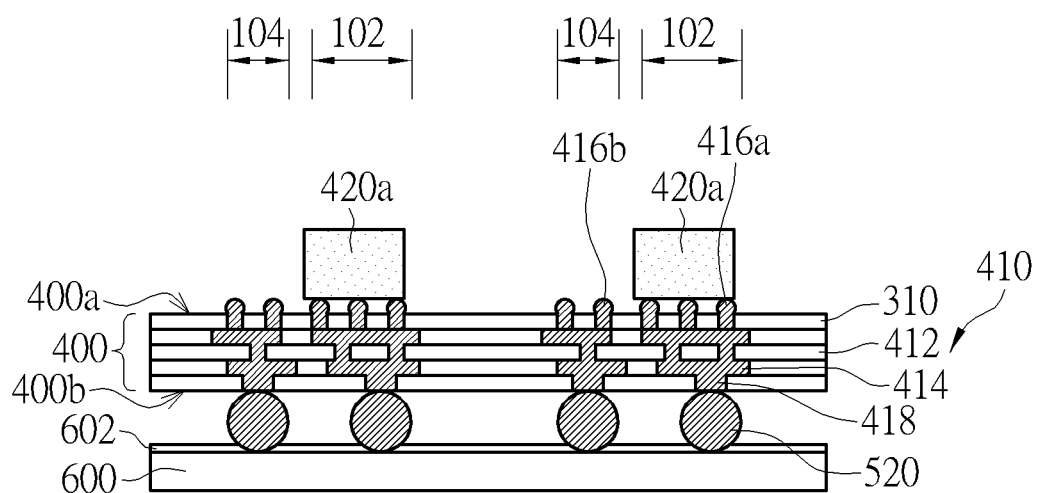

As shown in FIG. 6, subsequently, individual flip-chips or dies (first dies) 420a with their active sides facing down toward the RDL 410 are then mounted on the RDL 410 through the bumps 416a within the first chip mounting area 102, thereby forming a stacked chip-to-wafer (C2W) construction. These individual flip-chips or dies 420a are active integrated circuit chips with certain functions, for example, GPUs (graphics processing units) or CPUs (central processing units). Optionally, an underfill (not shown) may be applied under each chip or die 420a. At this point, the second chip mounting area 104 defined by the bumps 416b is vacant and no chip or die is mounted thereon at this point.

Figure 7:
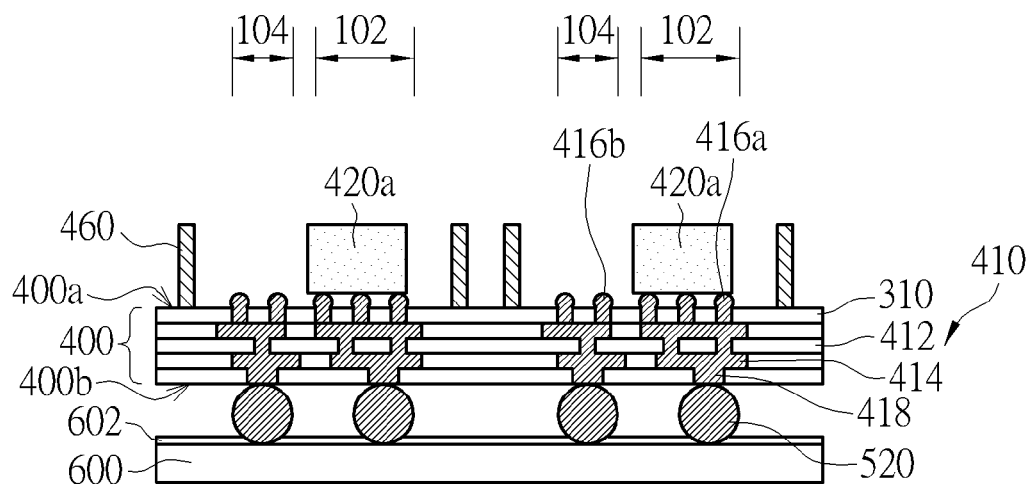
Figure 8:
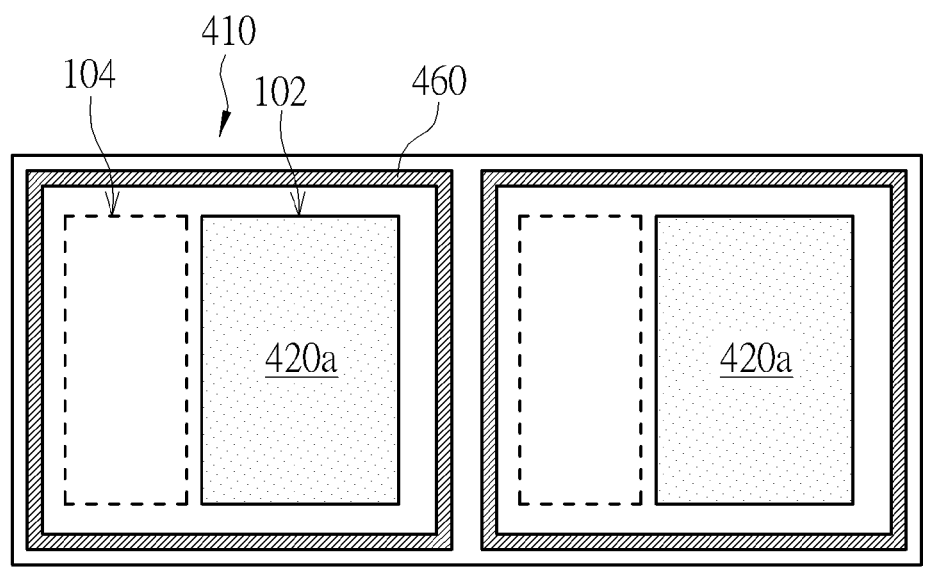
Figure 14:
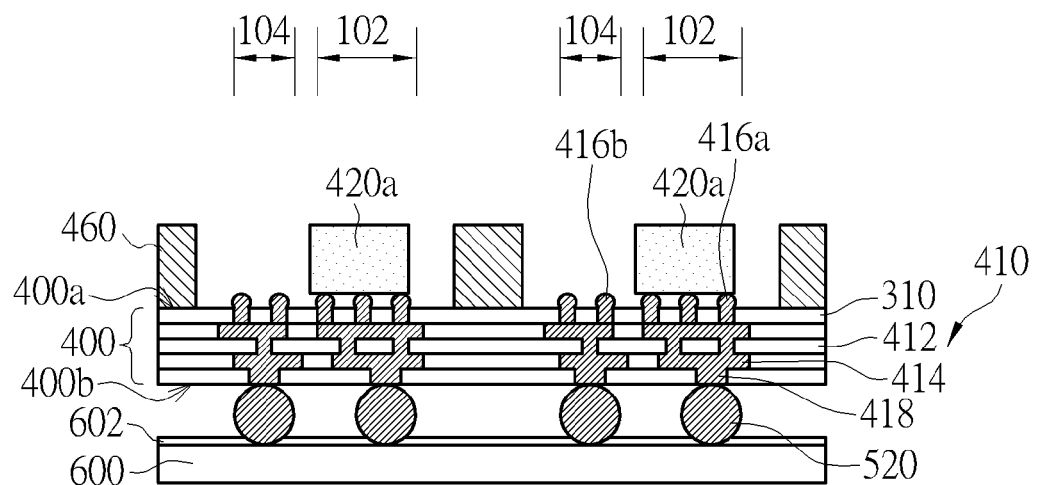
FIG. 14 and FIG. 15 show an exemplary layout of the supporting feature.
Figure 15:
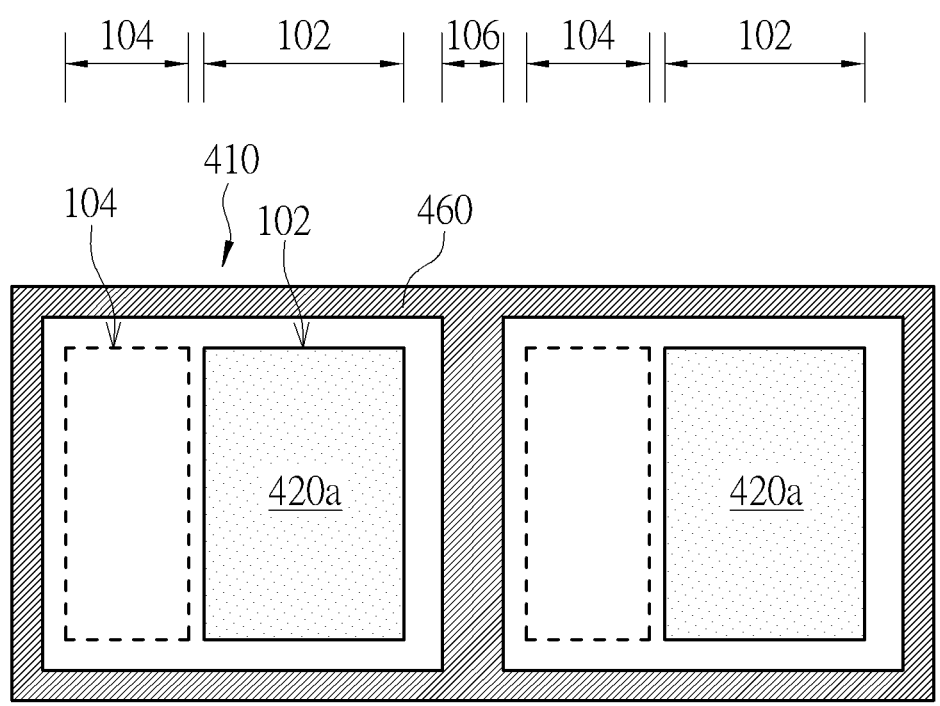

As shown in FIG. 7 and FIG. 8, supporting features 460 such as a ring-shaped or annular shaped supporting feature are formed on the RDL 410. More specifically, the supporting features 460 are formed on the top surface of the passivation layer 310. Each of the supporting features 460 encompasses the first chip mounting area 102 and the second chip mounting area 104. According to the embodiment, the supporting features 460 are independent and are not connected to one another. However, according to another embodiment, the supporting features 460 may be connected to one another. For example, as shown in FIG. 14 and FIG. 15, the supporting feature 460 has a grid-like pattern in a wafer level. The supporting feature 460 completely overlaps with a wafer dicing lane area 106.

According to the illustrated embodiment, the supporting feature 460 may comprise metal, but is not limited thereto. In other embodiments, the supporting feature 460 may comprise non-metal materials depending upon the design requirements.

According to the illustrated embodiment, the supporting feature 460 may be formed by three-dimensional (3D) printing methods, but is not limited thereto. In some embodiments, the supporting feature 460 may be prepared in advance, and then mounted onto the passivation layer 310 by using an adhesive layer or other means. According to the illustrated embodiment, the supporting feature 460 has an adequate height such that a top surface of the supporting feature 460 is flush with a top surface of the chip or die 420a.

Figure 13:
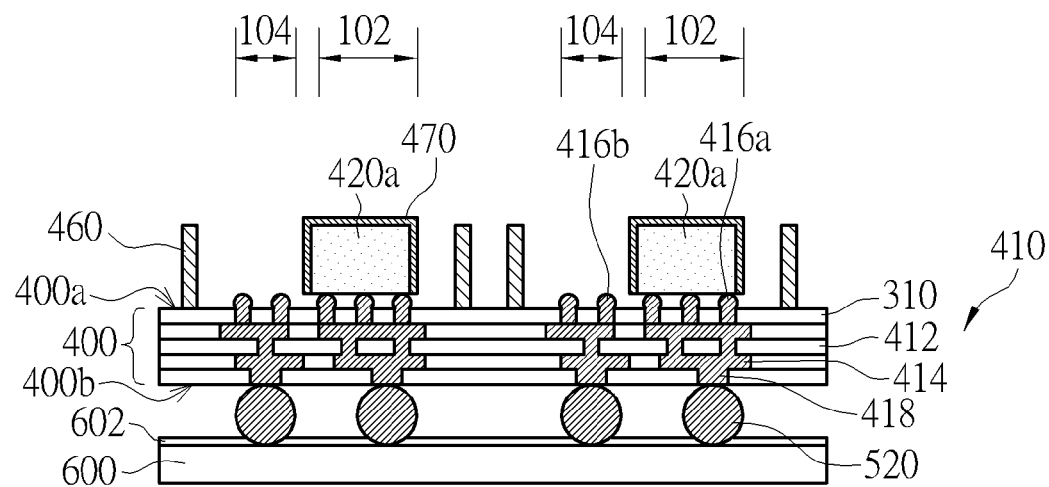
FIG. 13 is a schematic diagram showing sectional structure of an intermediate WLP product according to another embodiment of the invention.

According to another embodiment, as shown in FIG. 13, in addition to the supporting feature 460, a shielding feature 470 such as an electromagnetic interference (EMI) shielding feature may be formed directly on the top and side surfaces of the chip or die 420a concurrently. According to the illustrated embodiment, the shielding feature 470 may be formed by 3D printing methods, but is not limited thereto.

Figure 9:
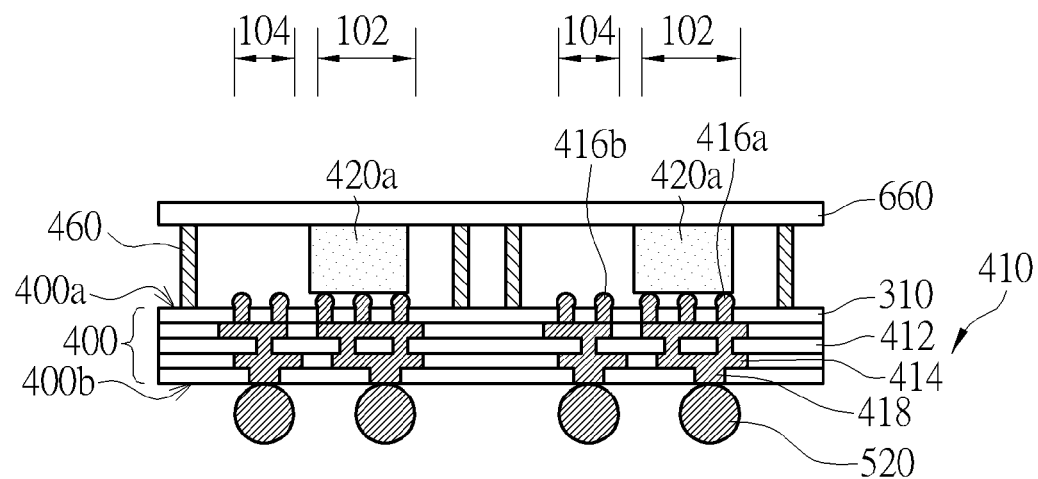

As shown in FIG. 9, subsequently, the intermediate WLP product may be attached to a dicing tape 660, where the supporting features 460 and dies 420a face toward, and may contact, the dicing tape 660. Thereafter, the carrier 600 and the adhesive layer 602 are removed to expose the solder balls 520.

Figure 10:
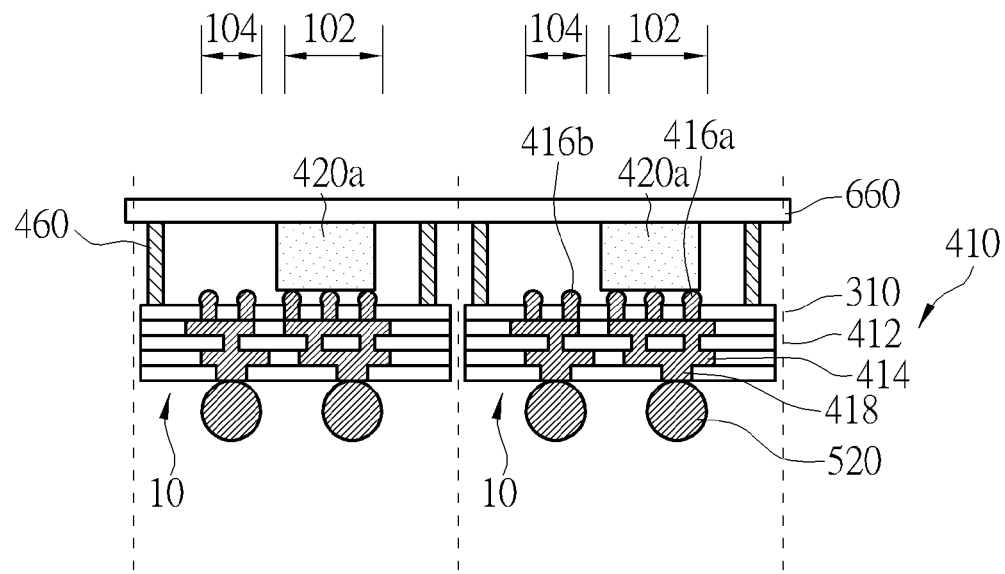

As shown in FIG. 10, after the carrier 600 and the adhesive layer 602 are removed, the intermediate WLP product is singulated into individual die packages 10 by dicing. At this point, each die package 10 comprises the RDL 410, a first die 420a mounted on the RDL 410, and the supporting feature 460. It is noteworthy that the second chip mounting area 104 is still vacant at this phase.

Figure 11:
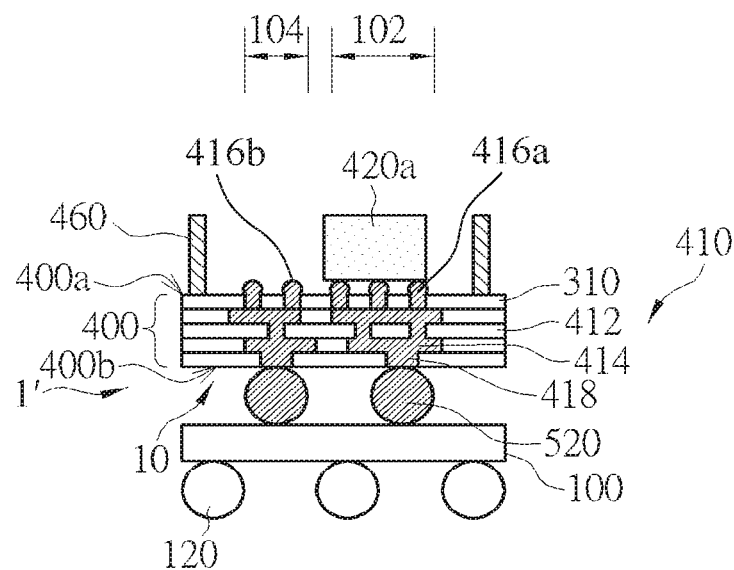

As shown in FIG. 11, subsequently, each die package 10 is mounted onto a substrate 100 such as a packaging substrate or a printed circuit board substrate to thereby form an intermediate package 1'. The die package 10 is mounted onto a top surface of the substrate 100. On the bottom surface of the substrate 100, a plurality of solder balls 120 may be provided. The intermediate package 1' is then tested. A testing process such as a reliability test or a yield test may be performed to test the intermediate package 1'.

Figure 12:
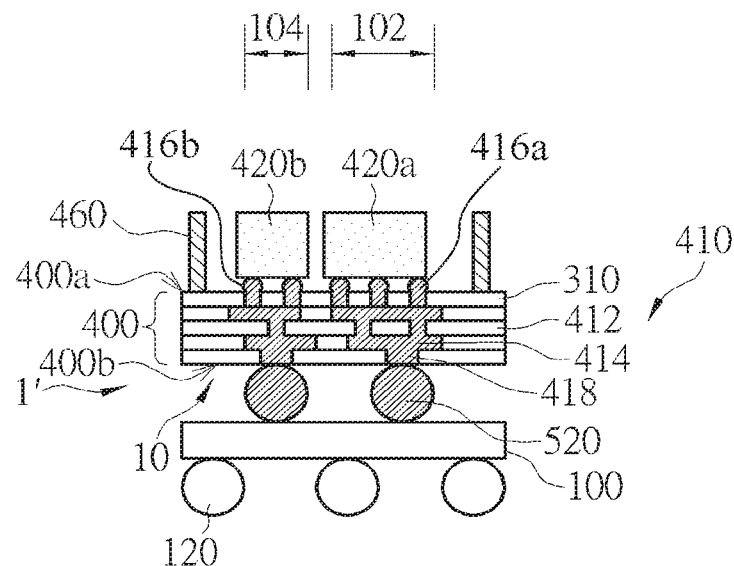

As shown in FIG. 12, after testing the intermediate package 1', a second chip or die 420b with its active side facing down toward the RDL 410 is mounted on the RDL 410 through the bumps 416b within the second chip mounting area 104, thereby forming a multi-die package 1. According to the illustrated embodiment, the second chip or die 420b may be a memory chip, but is not limited thereto. The multi-die package 1 is then tested. Optionally, a molding compound (not shown) may be applied to seal the first die 420a and the second die 420b.

To sum up, the present disclosure provides an improved semiconductor device and fabrication method that is capable of reducing the risk of known good die loss. The incorporation of the supporting feature 460 alleviates or avoids the warpage problem.

The semiconductor device includes a TSV-less interposer 400 having a first side 400a and a second side 400b opposite to the first side; a first semiconductor die 420a mounted on the first side 400a within a first chip mounting area 102 through a plurality of first bumps 416a; a second semiconductor die 420b mounted on the first side 400a within a second chip mounting area 104 being adjacent to the first chip mounting area 102; a ring-shaped supporting feature 460 disposed on the first side 400a and encompassing the first chip mounting area 102 and the second chip mounting area 104; and a plurality of solder bumps 520 mounted on the second side 400b.

The interposer 400 comprises a redistribution layer (RDL) 410. The RDL 410 comprises at least one dielectric layer 412 and at least one metal layer 414. The interposer 400 does not comprise a through silicon via (TSV) or a TSV substrate.

The ring-shaped supporting feature 460 may be a 3D printed feature. The semiconductor device may further comprise a shielding feature 470 (FIG. 13) directly disposed on a top surface and side surfaces of the first semiconductor die 420a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an interposer having a first side and a second side opposite to the first side;
   a first semiconductor die mounted on the first side within a first chip mounting area through a plurality of first bumps, wherein the first semiconductor die has a top surface and sidewall surfaces contiguous with the top surface;
   a second semiconductor die mounted on the first side within a second chip mounting area being adjacent to the first chip mounting area;
   a shielding feature directly disposed on the top surface and the sidewall surfaces of the first semiconductor die;
   a ring-shaped supporting feature disposed on the first side and encompassing the first chip mounting area and the second chip mounting area; and
   a plurality of solder bumps mounted on the second side, wherein no molding compound is disposed between the first semiconductor die and the second semiconductor die.

2. The semiconductor device according to claim 1, wherein the interposer comprises a redistribution layer (RDL).

3. The semiconductor device according to claim 2, wherein the RDL comprises at least one dielectric layer and at least one metal layer.

4. The semiconductor device according to claim 1, wherein the interposer does not comprise a through silicon via (TSV) or a TSV substrate.

5. The semiconductor device according to claim 1, wherein the first semiconductor comprises a graphics processing unit (GPU) or a central processing unit (CPU).

6. The semiconductor device according to claim 5, wherein the second semiconductor comprises a memory chip.

7. The semiconductor device according to claim 1, wherein the ring-shaped supporting feature is a 3D printed feature.

8. The semiconductor device according to claim 1, wherein the shielding feature is disposed on the first semiconductor die.

9. The semiconductor device according to claim 1, further comprising a packaging substrate connected to the plurality of solder bumps mounted on the second side of the interposer.

10. The semiconductor device according to claim 1, wherein the ring-shaped supporting feature completely overlaps with a wafer dicing lane area.

* * * * *

UNITED STATES PATENT AND TRADEMARK OFFICE
CERTIFICATE OF CORRECTION

PATENT NO. : 9,748,184 B2  Page 1 of 1
APPLICATION NO. : 14/883632
DATED : August 29, 2017
INVENTOR(S) : Shing-Yih Shih et al.

It is certified that error appears in the above-identified patent and that said Letters Patent is hereby corrected as shown below:

In the Specification

| | | |
|---|---|---|
| Column 1, | Line 4, | change "BACKGROUND OF THE INVENTION" to --TECHNICAL FIELD-- |
| Column 1, | Line 11, | prior to subtitle "2. Description of the Prior Art" insert title --BACKGROUND-- |
| Column 1, | Line 44, | change "SUMMARY OF THE INVENTION" to --BRIEF SUMMARY-- |
| Column 2, | Line 14, | change "constitute apart of" to --constitute a part of-- |
| Column 2, | Line 50, | change ""die", "semiconductor chip"," to --"die," "semiconductor chip,"-- |

Signed and Sealed this
Fourteenth Day of November, 2017

Joseph Matal
*Performing the Functions and Duties of the
Under Secretary of Commerce for Intellectual Property and
Director of the United States Patent and Trademark Office*